United States Patent
Hong et al.

(10) Patent No.: US 8,720,707 B2
(45) Date of Patent: May 13, 2014

(54) FRAME USING INTERIOR CONNECTORS FOR HOLDING HIGHLY-CONCENTRATED SOLAR CELLS

(75) Inventors: Hwen-Fen Hong, Taoyuan County (TW); Zun-Hao Shih, Taoyuan County (TW); hwa-yuh Shin, Taoyuan County (TW); Cherng-Tsong Kuo, Taoyuan County (TW)

(73) Assignee: Institute of Nuclear Energy Research, Atomic Energy Council, Lungtan, Taoyuan (TW)

( * ) Notice: Subject to any disclaimer, the term of this patent is extended or adjusted under 35 U.S.C. 154(b) by 0 days.

(21) Appl. No.: 13/585,085

(22) Filed: Aug. 14, 2012

(65) Prior Publication Data

US 2014/0048497 A1 Feb. 20, 2014

(51) Int. Cl.
*F24J 2/46* (2006.01)

(52) U.S. Cl.
USPC ......... 211/182; 126/704; 312/265.4; 403/231

(58) Field of Classification Search
USPC ............ 211/41.1, 41.14, 41.15, 85.15, 85.16, 211/182, 183; 312/140, 265.1, 265.2, 312/265.3, 265.4; 40/782, 783, 784, 785; 403/231, 295; 52/36.5
See application file for complete search history.

(56) References Cited

U.S. PATENT DOCUMENTS

| | | | | |
|---|---|---|---|---|
| 3,016,642 A | * | 1/1962 | Kowalski | 40/785 |
| 3,150,903 A | * | 9/1964 | Chapman et al. | 312/265.4 |
| 3,265,416 A | * | 8/1966 | Downes | 403/264 |
| 3,698,114 A | * | 10/1972 | Hirsch et al. | 40/782 |
| 4,073,113 A | * | 2/1978 | Oudot et al. | 52/710 |
| 4,368,584 A | * | 1/1983 | Logan | 40/785 |
| 4,438,578 A | * | 3/1984 | Logan | 40/782 |
| 4,516,341 A | * | 5/1985 | Jenkins | 40/785 |
| 4,718,184 A | * | 1/1988 | Sherman | 40/785 |
| 4,862,612 A | * | 9/1989 | Sugihara et al. | 40/782 |
| 4,974,352 A | * | 12/1990 | Shwu-Jen | 40/783 |
| 5,046,791 A | * | 9/1991 | Kooiman | 312/265.1 |
| 5,609,402 A | * | 3/1997 | Kemp | 312/265.4 |
| 6,059,322 A | * | 5/2000 | Nagai et al. | 285/125.1 |
| 6,331,092 B1 | * | 12/2001 | Linger | 403/382 |
| 6,467,635 B1 | * | 10/2002 | McComb et al. | 211/85.16 |
| 6,481,177 B1 | * | 11/2002 | Wood | 52/656.9 |
| 7,726,301 B2 | * | 6/2010 | Shin et al. | 126/704 |
| 7,735,484 B2 | * | 6/2010 | Shin et al. | 126/704 |
| 8,356,446 B2 | * | 1/2013 | Takeda et al. | 52/79.12 |
| 8,474,213 B2 | * | 7/2013 | Oetlinger | 52/655.1 |
| 2004/0036389 A1 | * | 2/2004 | Tsai | 312/265.4 |
| 2010/0102011 A1 | * | 4/2010 | Blum | 211/8 |

FOREIGN PATENT DOCUMENTS

JP 03199705 A * 8/1991 ............... F16B 7/18

* cited by examiner

*Primary Examiner* — Joshua Rodden
(74) *Attorney, Agent, or Firm* — Jackson IPG PLLC

(57) ABSTRACT

A frame is provided for highly-concentrated photovoltaic cells. The frame uses vertical and horizontal rods. Connectors are fixed at where the vertical and horizontal rods connect. The frame is constructed with the rods and connectors coordinated with fixing components. Thus, solar cell receivers can be directly set at any place on the frame; and the frame can be easily constructed and safely moved. Furthermore, location space is effectively used and weather resistance is achieved.

7 Claims, 4 Drawing Sheets

FRAME USING INTERIOR CONNECTORS FOR HOLDING HIGHLY-CONCENTRATED SOLAR CELLS

TECHNICAL FIELD OF THE INVENTION

The present invention relates to a frame for solar cells; more particularly, relates to using horizontal rods and vertical rods to form a frame coordinated with connectors having fixing components prevented from being exposed, where solar cell receivers can be directly set at anywhere on the frame and the present invention can be assembled rapidly and moved easily and effectively use location space while also being weather-resisting.

DESCRIPTION OF THE RELATED ARTS

For assembling a solar cell module, a frame 3 uses prisms 31 coordinated with screws 32. Yet, the assembling procedure is complex and the screws 32 get rusted easily owing to their exposure. Besides, the exposed head part of the screw 32 may hurt a human finger owing to its sharp edge. The rusted screws 32 may even make maintenance or de-assembly of the frame difficult.

On the other hand, an 'L'-shape connector is usually used for connecting rods of the frame when assembling the frame. However, the 'L'-shape connector is directly fixed on the rod and is not effective for holding solar cells. Hence, the prior arts do not fulfill all users' requests on actual use.

SUMMARY OF THE INVENTION

The main purpose of the present invention is to use horizontal rods and vertical rods to form a frame coordinated with connectors having fixing components prevented from being exposed, where solar cell receivers can be directly set at anywhere on the frame and the present invention can be assembled rapidly and moved easily and effectively use location space while also being weather-resisting.

To achieve the above purpose, the present invention is a frame using interior connectors for holding highly-concentrated solar cells, comprising a frame body and a plurality of connectors, where the frame body comprises a plurality of horizontal rods and a plurality of vertical rods; the vertical rods are perpendicular to the horizontal rods; each horizontal rod has two vertical rods separately at two ends of the horizontal rod; each horizontal rod has a first flute on an inner surface of the horizontal rod; each vertical rod has a second flute on an inner surface of the vertical rod; each first flute is adhered to two second flutes; and each connector is fixed in a first flute and a neighboring second flute. Accordingly, a novel frame using interior connectors for holding highly-concentrated solar cells is obtained.

BRIEF DESCRIPTIONS OF THE DRAWINGS

The present invention will be better understood from the following detailed description of the preferred embodiment according to the present invention, taken in conjunction with the accompanying drawings, in which FIG. 1 is the explosive view showing the preferred embodiment according to the present invention;

DESCRIPTION OF THE PREFERRED EMBODIMENT

The following description of the preferred embodiment is provided to understand the features and the structures of the present invention.

Figure 1:
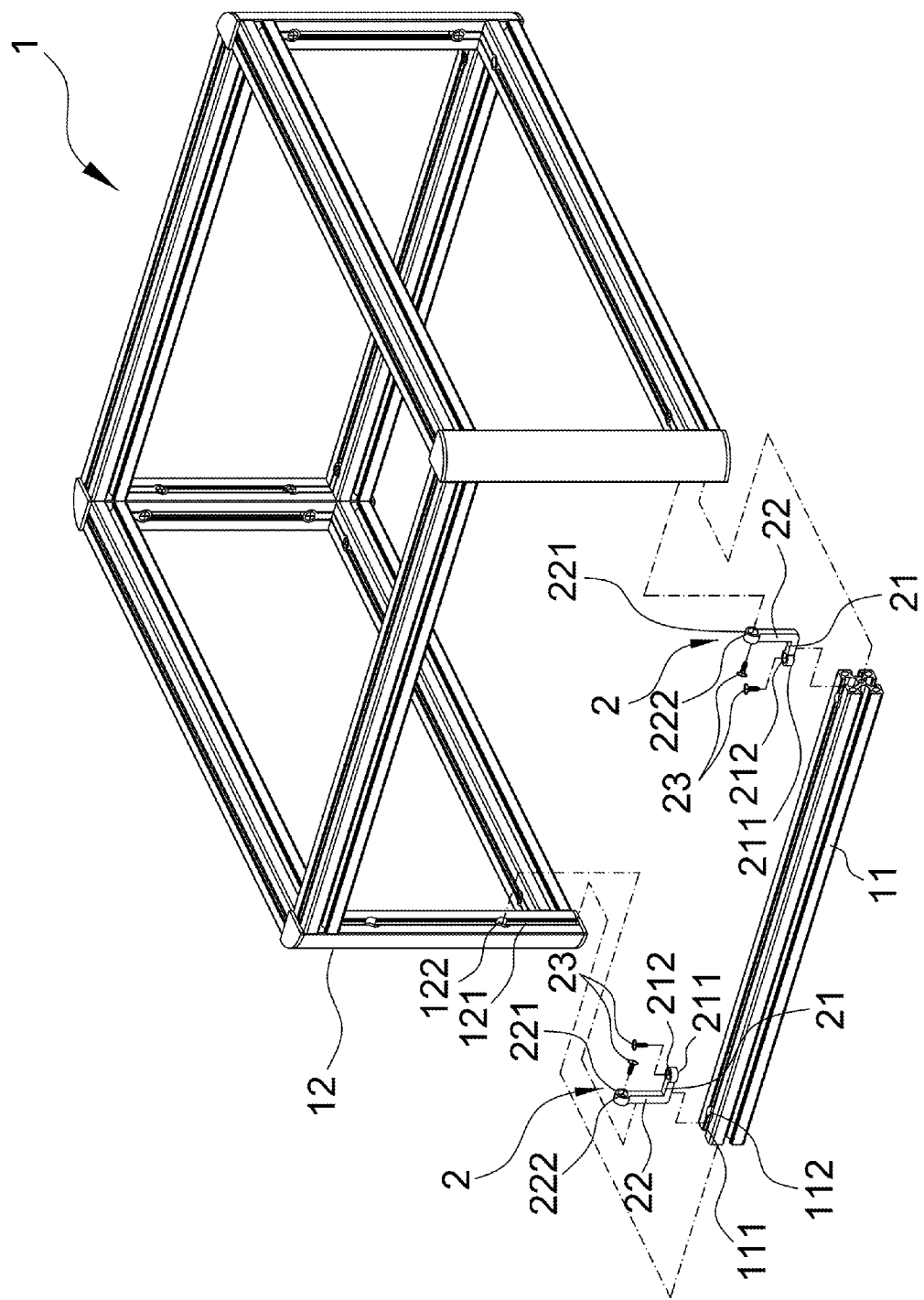
Figure 2:
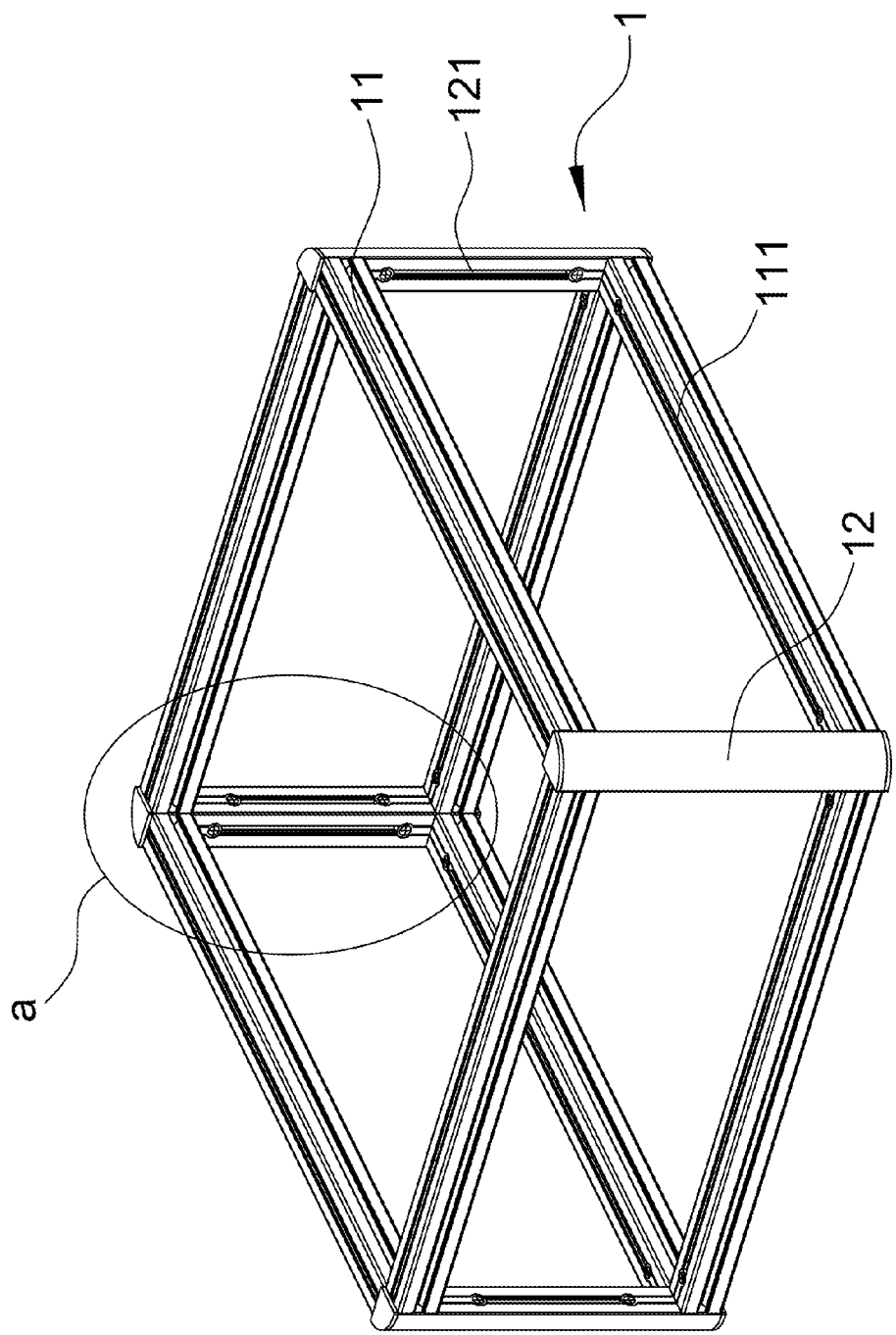
FIG. 2 is the perspective view showing the preferred embodiment.
Figure 3:
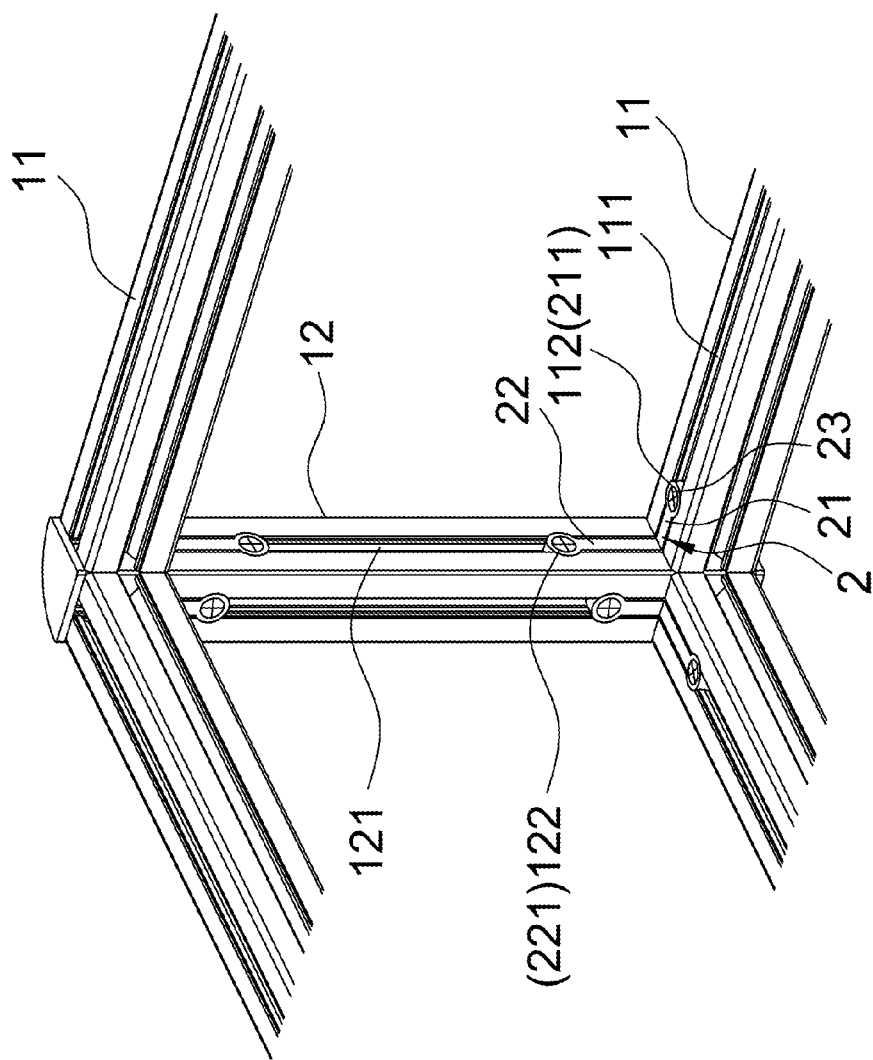
FIG. 3 is the view showing the area a of FIG. 2.
Figure 4:
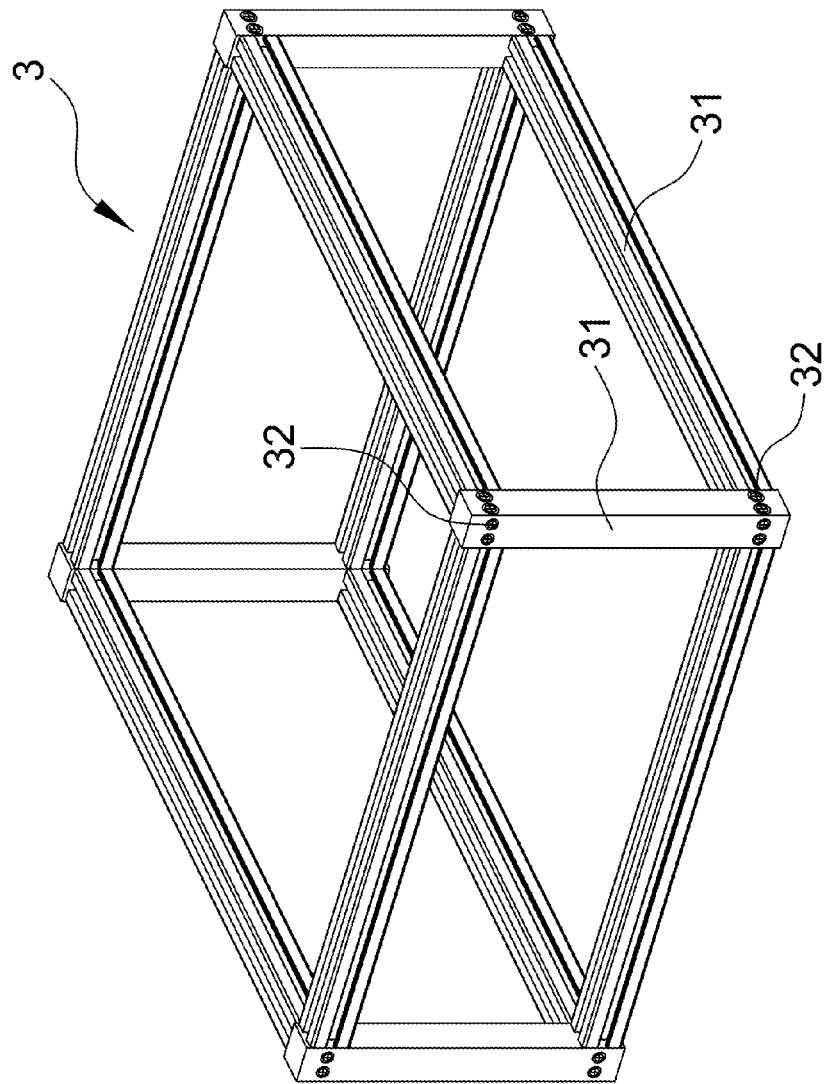
FIG. 4 is the view of the prior art.

Please refer to FIG. 1 to FIG. 3, which are an explosive view and a perspective view showing a preferred embodiment according to the present invention and a view showing area a of FIG. 2. As shown in the figures, the present invention is a frame using interior connectors for holding highly-concentrated solar cells, comprising a frame body 1 and a plurality of connectors 2.

The frame body 1 comprises a plurality of horizontal rods 11 and a plurality of vertical rods 12. Every horizontal rod 11 has two vertical rods 12 separately set at two ends of the horizontal rod 11. The horizontal rod 11 and the vertical rod 12 have a first flute 111 and a second flute 121 on inner surfaces of the horizontal rod 11 and the vertical rod 12, respectively. Every first flute 111 is adhered to two second flute 121. The horizontal rods 11 and the vertical rods 12 are made of metal materials or non-metal materials. The horizontal rod 11 and the vertical rod 12 have limit slots 112,122 on the first flute 111 and the second flute 121, separately. Each limit slot 112,122 on the first flute 111 and the second flute 121 has a width wider than the first flute 111 and the second flute 121, respectively.

Every connector 2 is fixed in the first flute 111 of the horizontal rod 11 and the adhering second flute 121 of the vertical rod 12. Every connector 2 is made of a metal material or a non-metal material. Every connector 2 comprises a first scarfing part 21, a second scarfing part 22 and two fixing parts 211,221, where the first scarfing part 21 is set in the first flute 111 of the horizontal rod 11; the second scarfing part 22 is connected with the first scarfing part 21 and is set in the second flute 121 of the vertical rod 12; and the fixing parts 211,221 are set at an end of the first scarfing part 21 and an end of the second scarfing part 22, separately, and are contained in the limit slots 112,122. Each fixing part 211,221 is wider than the first or the second scarfing part 21,22 where the fixing part 211,221 is located in. Each fixing part 211,221 having a surface coplanar with a surface of its respective scarfing part 21,22 and extending parallel to a longitudinal axis of its respective scarfing part 21,22. Each fixing part 211,221 is corresponding to a limit slot 112,122 and has a circular shape or a polygonal shape. The first scarfing part 21 and the second scarfing part 22 of the connector are perpendicular to each other to form an 'L'-shape of the connector 2. Every fixing part 211,221 has a screw hole 212,222 for being fixed to the limit slot 112,122 of the first or the second flute 111,121 with coordination of a fixing component 23, where the fixing component 23 is a bolt or a fixing screw. When the fixing component 23 is a bolt, no tool is needed for assembling the present invention. Thus, a novel frame using interior connectors for holding highly-concentrated solar cells is obtained.

On assembling the present invention, two ends of every neighboring horizontal rod 11 and vertical rod 12 are connected with each other to form the frame body 1 with the horizontal rods 11 and the vertical rods 12. The first flute 111 and the second flute 121 of the horizontal rod 11 and the vertical rod 12 are adhered and perpendicular to each other, respectively. The first scarfing part 21 and the second scarfing part 22 of the connector 2 are respectively embedded in the neighboring first flute 111 and second flute 121 of the horizontal rod 11 and the vertical rod 12. The fixing parts 211,221 at an end of the first scarfing part 21 and an end of the second scarfing part 22 are contained in the limit slots 112,122, separately. At last, through the screw holes 212,222 of the fixing parts 211,221, the fixing components 23 are used to fix and combine the horizontal rods 11 and the vertical rods 12 to form a frame rapidly. The horizontal rods 11 and the vertical rods 12 use the first flute 111 and the second flute 121 coordinated with the connectors 2 to form the frame body 1 while the fixing components 23 is prevented from being exposed. Thus, solar cell receivers can be directly set at anywhere of the frame; human fingers would not be cut by the out-exposing fixing components 23; and the fixing components 23 will not easily get rust. Hence, the present invention can be moved easily and effectively use location space while also being weather-resisting.

To sum up, the present invention is a frame using interior connectors for holding highly-concentrated solar cells, where horizontal rods and vertical rods are used to form a frame coordinated with connectors while fixing components is prevented from being exposed; solar cell receivers can be directly set at anywhere on the frame; and the present invention can be assembled rapidly and moved easily and effectively use location space while also being weather-resisting.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A frame using interior connectors for holding highly-concentrated solar cells, comprising:
    a frame body, said frame body comprising a plurality of first rods and a plurality of second rods, said second rods being perpendicular to said first rods,
    each of said first rods being in contact with four of said second rods and having two of said second rods separately at each of two ends of said first rods,
    each of said first rods having a first flute on an inner surface of said each of said first rods,
    each of said second rods having a second flute on an inner surface of said each of said second rods, each of said first flutes being adhered to two of said second flutes;
    a plurality of solid connectors having a square or rectangular cross-section, each of said connectors being fixed in one of said first flutes and a respective one of said second flutes;
    wherein each of said first rods and each of said second rods have limit slots on said first flute and said second flute, separately;
    each of said connectors comprises a first scarfing part, a second scarfing part and two fixing parts;
    said first scarfing part is located in said first flute of said first rod;
    said second scarfing part is connected with said first scarfing part and is located in said second flute of said second rod;
    said fixing parts are located in said limit slots at an end of said first scarfing part and an end of said second scarfing part, separately;
    each fixing part having a surface coplanar with a surface of its respective scarfing part and extending parallel to a longitudinal axis of its respective scarfing part;
    wherein each limit slot has a width wider than a flute selected from a group consisting of said first flute and said second flute where said limit slot is located in;
    wherein each fixing part has a width wider than a part selected from a group consisting of said first scarfing part and said second scarfing part where said fixing part is located in.

2. The frame according to claim 1, wherein said first rods and said second rods are made of materials selected from a group consisting of metal materials and non-metal materials.

3. The frame according to claim 1, wherein said connectors are made of materials selected from a group consisting of metal materials and non-metal materials.

4. The frame according to claim 1, wherein said first scarfing part of said connector and said second scarfing part of said connector are perpendicular to each other to form an 'l'-like shape of said connector; and
    each fixing part has a screw hole to fix one of said fixing parts to one of said limit slots of one of said flutes through said screw hole coordinated with a fixing component.

5. The frame according to claim 4, wherein said fixing component is selected from a group consisting of a bolt and a fixing screw.

6. The frame according to claim 1, wherein each limit slot has a shape selected from a group consisting of a circular shape and a polygonal shape.

7. The frame according to claim 1, wherein each fixing part has a shape selected from a group consisting of a circular shape and a polygon shape.

* * * * *